(12) United States Patent
Yamashita

(10) Patent No.: US 8,400,541 B2
(45) Date of Patent: Mar. 19, 2013

(54) PHOTOELECTRIC CONVERSION APPARATUS AND IMAGING SYSTEM USING THE SAME

(75) Inventor: Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 371 days.

(21) Appl. No.: 12/922,865

(22) PCT Filed: May 8, 2009

(86) PCT No.: PCT/JP2009/059021
§ 371 (c)(1), (2), (4) Date: Sep. 16, 2010

(87) PCT Pub. No.: WO2009/136665
PCT Pub. Date: Nov. 12, 2009

(65) Prior Publication Data
US 2011/0013067 A1 Jan. 20, 2011

(30) Foreign Application Priority Data
May 9, 2008 (JP) .................... 2008-123439

(51) Int. Cl.
*H04N 3/14* (2006.01)
*H04N 5/335* (2006.01)
*H01L 27/00* (2006.01)
*H01L 31/062* (2006.01)
*H01L 31/113* (2006.01)

(52) U.S. Cl. ............... 348/296; 348/302; 250/208.1; 257/291

(58) Field of Classification Search ............... 348/294, 348/296, 301, 302, 308; 250/208.1; 257/290–291
See application file for complete search history.

(56) References Cited

U.S. PATENT DOCUMENTS

| 5,880,495 | A | * | 3/1999 | Chen | 257/233 |
| 6,528,833 | B2 | * | 3/2003 | Lee et al. | 257/292 |
| 2002/0190288 | A1 | * | 12/2002 | Lee et al. | 257/292 |
| 2004/0051801 | A1 | * | 3/2004 | Iizuka et al. | 348/294 |
| 2006/0208285 | A1 | | 9/2006 | Inoue et al. | 257/239 |
| 2008/0179639 | A1 | * | 7/2008 | Gambino et al. | 257/291 |

FOREIGN PATENT DOCUMENTS

| JP | 55-160477 A | 12/1980 |
| JP | 2-161878 A | 6/1990 |
| JP | 6-236987 A | 8/1994 |
| JP | 10-214957 A | 8/1998 |
| JP | 2004-39671 A | 2/2004 |
| JP | 2004-63498 A | 2/2004 |
| JP | 2004-111590 A | 4/2004 |
| JP | 2006-261411 A | 9/2006 |
| JP | 2007-335439 A | 12/2007 |

* cited by examiner

*Primary Examiner* — Daniel Pasiewicz
(74) *Attorney, Agent, or Firm* — Fitzpatrick, Cella, Harper & Scinto

(57) ABSTRACT

A photoelectric conversion apparatus includes: a first semiconductor region forming a part of a photoelectric conversion element; a second semiconductor region stacked on the first semiconductor region, and forming a part of the photoelectric conversion element; a third semiconductor region to which a signal charge transferred from the photoelectric conversion element; a fourth semiconductor region of the first conductivity type having an higher impurity concentration, between the first and third semiconductor region and between the second and third semiconductor regions, closer to a main surface than the first semiconductor region, and connected to the first semiconductor region; a first gate electrode over the fourth semiconductor region, an insulating film on the main surface and between the first gate electrode and the fourth semiconductor region; and a second gate electrode between the third and fourth semiconductor regions, and over the insulating film.

10 Claims, 12 Drawing Sheets

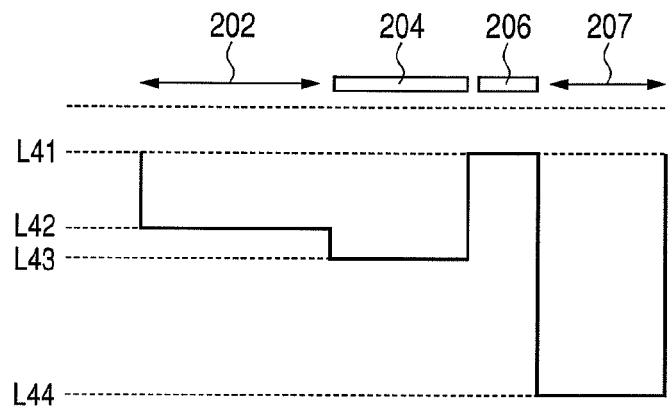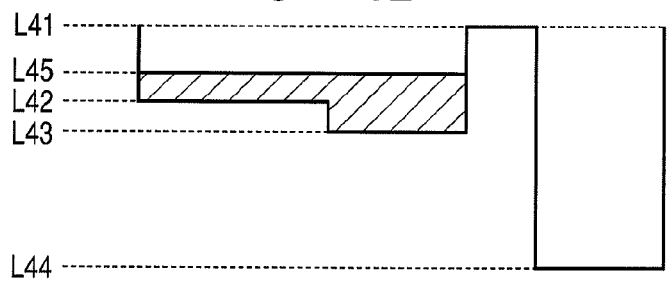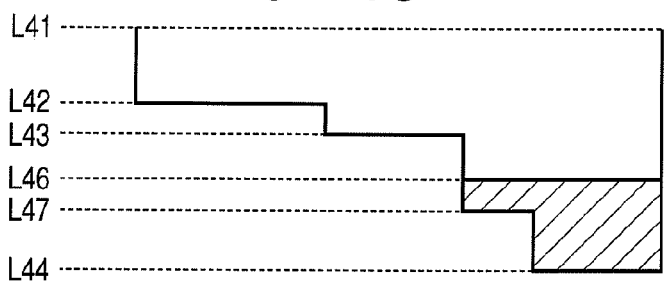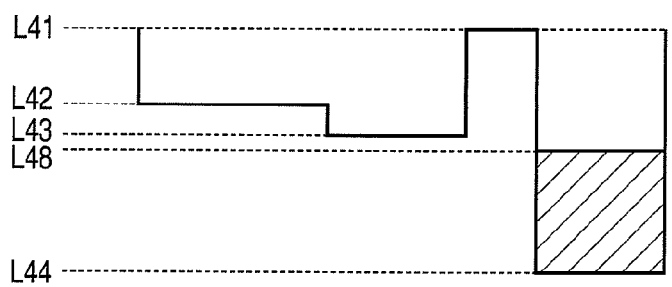

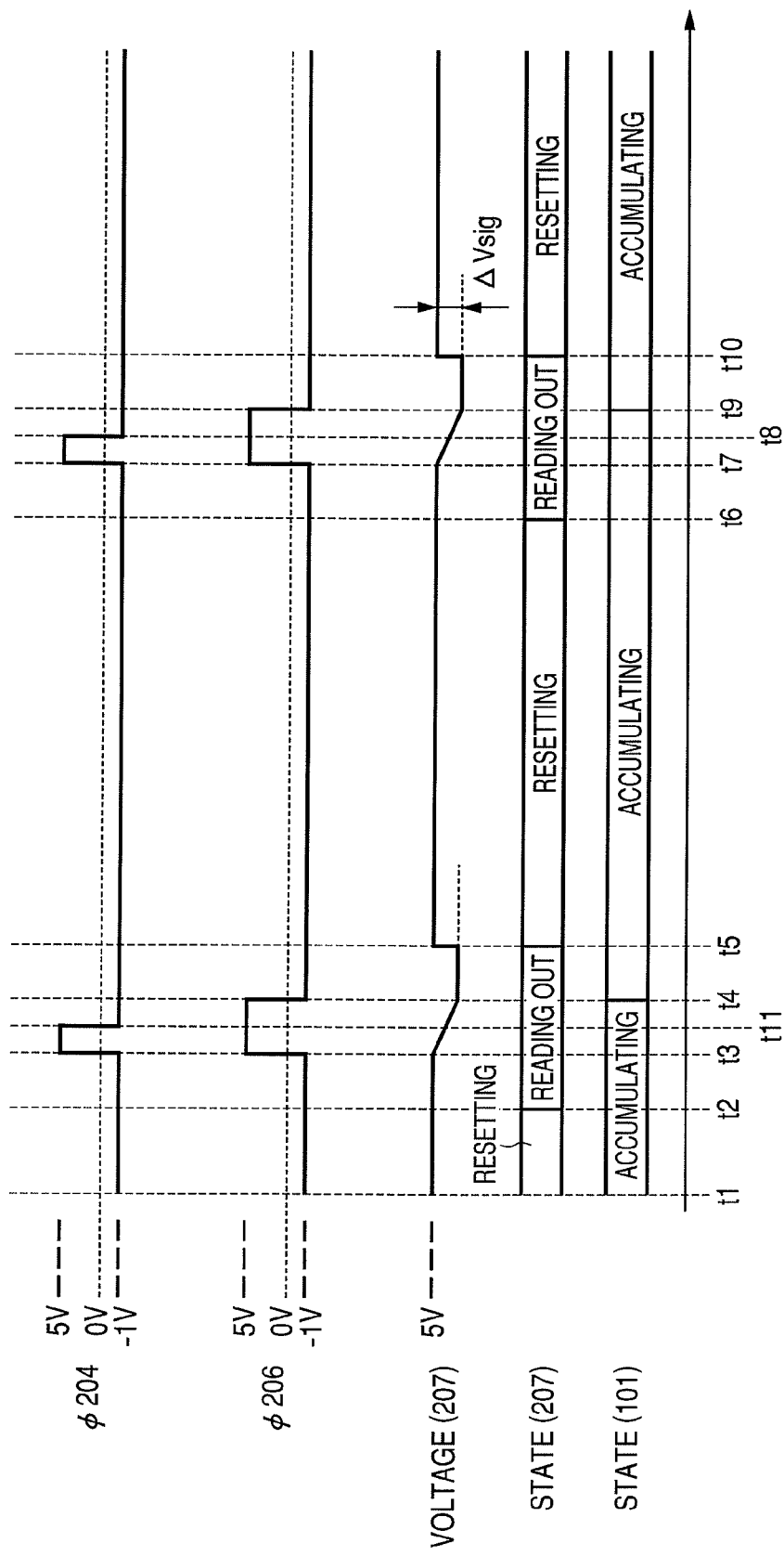

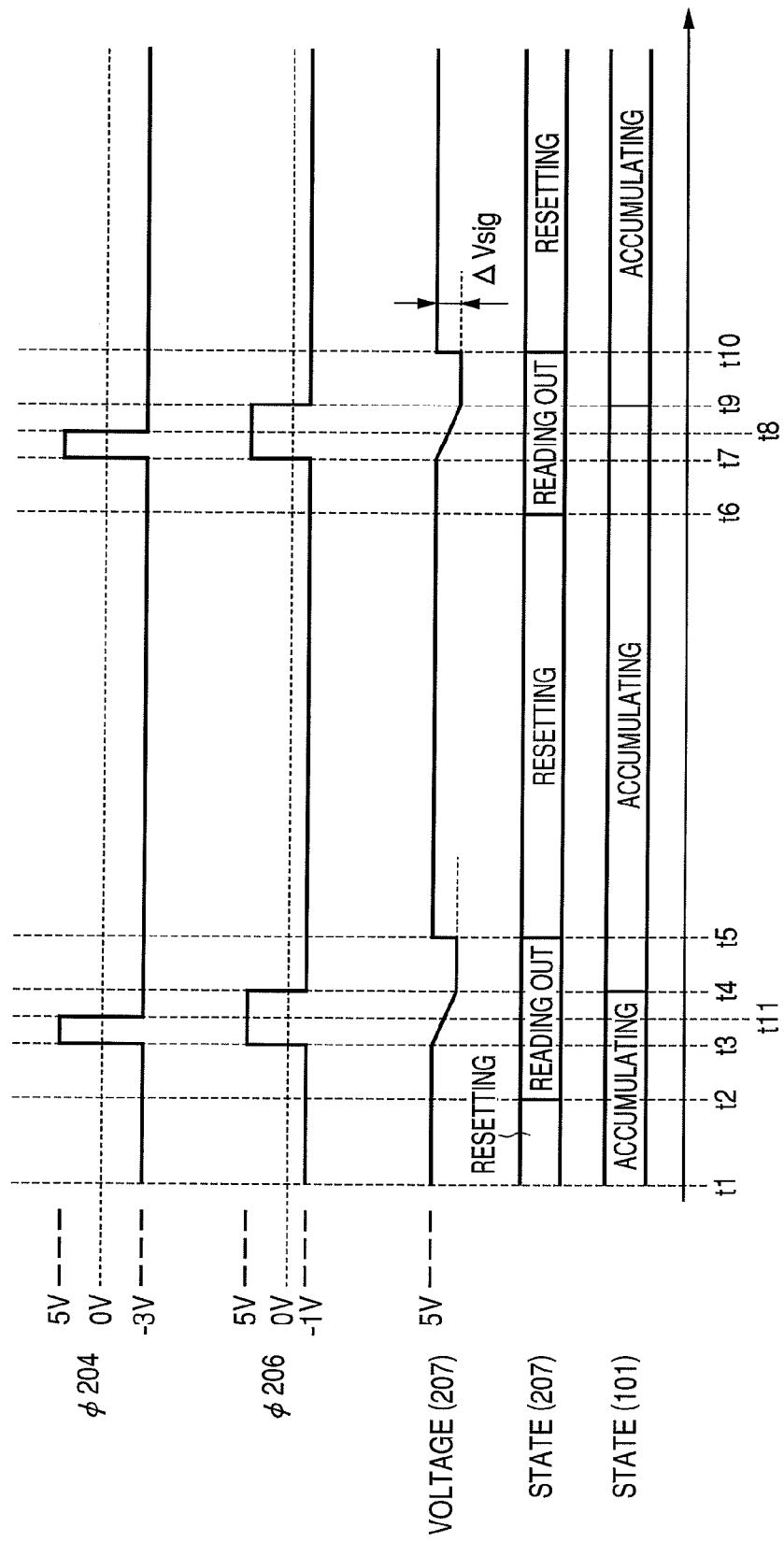

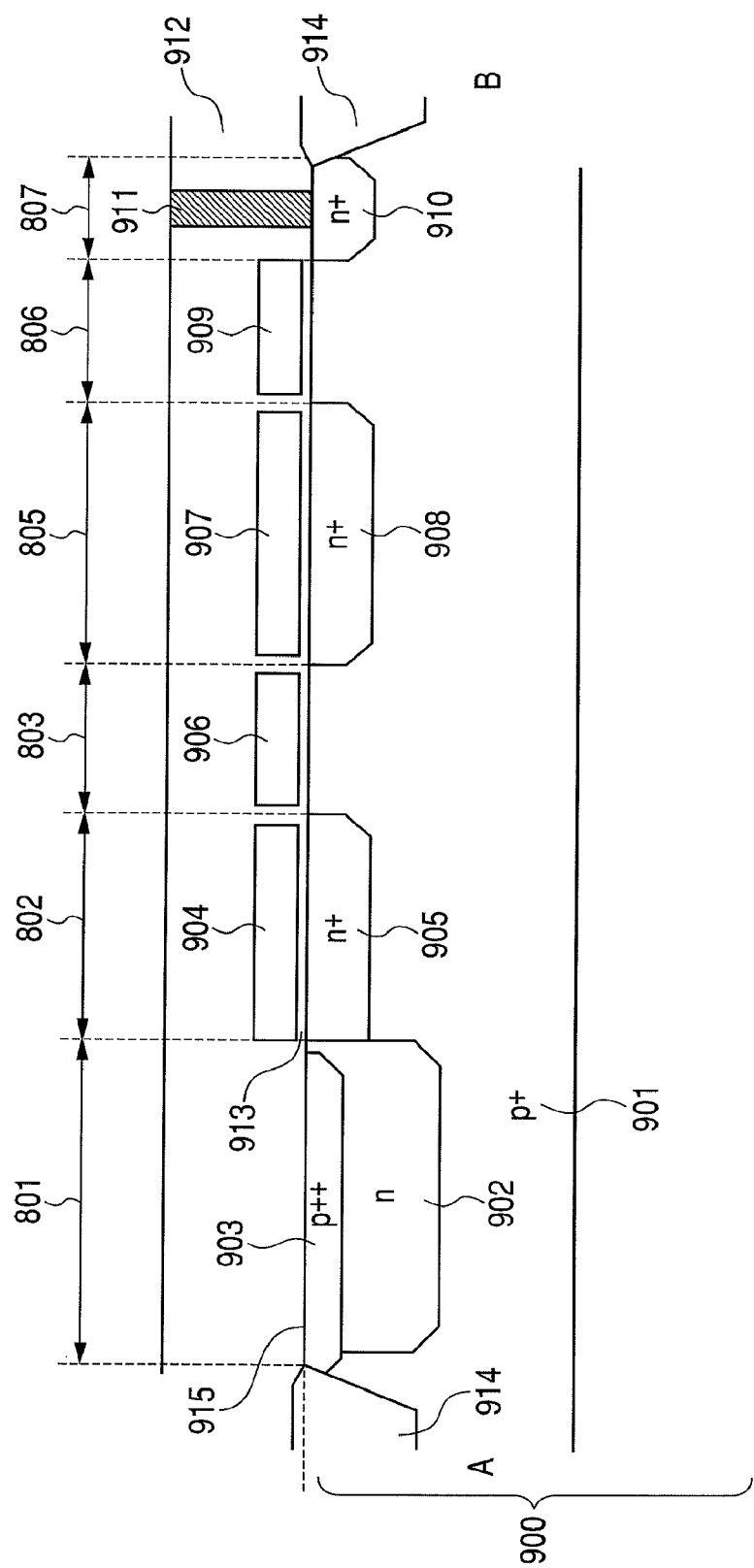

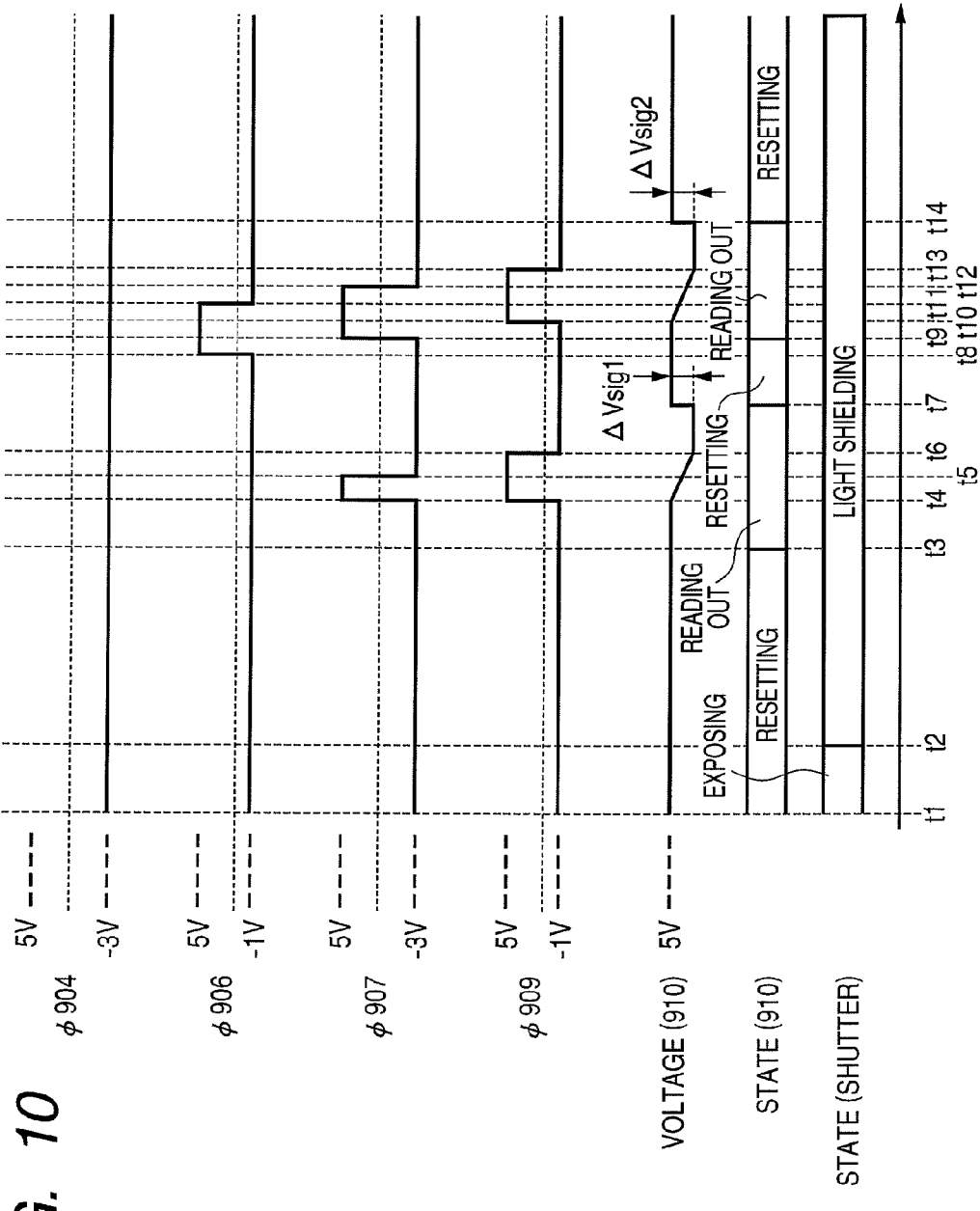

PHOTOELECTRIC CONVERSION APPARATUS AND IMAGING SYSTEM USING THE SAME

TECHNICAL FIELD

The present invention relates to a photoelectric conversion apparatus, in particular to a transfer structure of a signal charge from a photoelectric conversion element.

BACKGROUND ART

Conventionally, known photoelectric conversion apparatuses include an apparatus which transfers a charge of a photoelectric conversion element to a floating diffusion region through a transfer MOS transistor and converts it into a voltage to read out.

Concerning such photoelectric conversion apparatus, Japanese Patent Application Laid-Open No. 2004-063498 discloses a configuration in which a signal charge is read out at a low voltage and no signal charges are left behind. Specifically, it is a photoelectric conversion apparatus that includes a first gate electrode approximately adjacent to one end of a photodiode region, a second gate electrode adjacent to the first gate electrode and a drain region approximately adjacent to one end of the second gate electrode.

However, according to the configuration disclosed in Japanese Patent Application Laid-Open No. 2004-063498, since a photodiode is formed deeply under the first gate electrode, and the photodiode and the drain region are situated close to each other when the size of pixel is reduced, a punch-through may be possibly produced in a bulk, resulting in an electrically conducting state.

Therefore, an object of the present invention is to provide a photoelectric conversion apparatus in which electrical connection between a photoelectric conversion element and a drain region can be controlled easily, and transfer efficiency of a charge from the photoelectric conversion element can be improved.

DISCLOSURE OF THE INVENTION

A photoelectric conversion apparatus according to the present invention includes: a semiconductor substrate having a main surface; a first semiconductor region of a first conductivity type forming a part of a photoelectric conversion element; a second semiconductor region of a second conductivity type opposite to the first conductivity type being stacked on the first semiconductor region, and forming a part of the photoelectric conversion element; a third semiconductor region of the first conductivity type to which a signal charge transferred from the photoelectric conversion element; a fourth semiconductor region of the first conductivity type having an impurity concentration higher than that of the first semiconductor region, being arranged between the first and third semiconductor region and being arranged between the second and third semiconductor regions, closer to the main surface than the first semiconductor region, and being connected to the first semiconductor region; a first gate electrode arranged over the fourth semiconductor region, an insulating film arranged on the main surface and arranged between the first gate electrode and the fourth semiconductor region; and a second gate electrode arranged between the third and fourth semiconductor regions, and arranged over the insulating film.

The photoelectric conversion apparatus of the present invention can facilitate controlling electrical connection between the photoelectric conversion element and the drain region and improve transfer efficiency of a signal charge.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 4A, 4B, 4C and 4D are potential maps illustrating the first embodiment.

FIG. 5 is an operational timing chart illustrating a second embodiment.

FIG. 7 is an operational timing chart illustrating a third embodiment.

FIG. 9 is a cross-sectional schematic view illustrating the fourth embodiment.

FIG. 10 is an operational timing chart illustrating the fourth embodiment.

The accompanying drawings, which are incorporated in and constitute a part of the specification, illustrate embodiments of the invention and, together with the description, serve to explain the principles of the invention.

BEST MODE FOR CARRYING OUT THE INVENTION

A photoelectric conversion apparatus according to the present invention includes: a photoelectric conversion element having a first semiconductor region of a first conductivity type and a second semiconductor region of a second conductivity type; and a fourth semiconductor region of the second conductivity type, connected to the second semiconductor region. This fourth semiconductor region has an impurity concentration higher than that of the second semiconductor region and is arranged closer to the main surface rather than the second semiconductor region. Then, the photoelectric conversion apparatus includes a first gate electrode covering the fourth semiconductor region and a second gate electrode for controlling electrical connection between the fourth semiconductor region and a third semiconductor region. Such configuration can improve transfer efficiency of a signal charge while facilitating separation of the photoelectric conversion element from a drain region.

Also, at least for a time period during which a signal charge is accumulated in the photoelectric conversion element, a charge having a polarity opposite to that of the signal charge is accumulated under the first gate electrode. Such configuration can reduce mixing of dark current due to a defect of an interface of a semiconductor substrate.

Note that an outer edge of a semiconductor region can be determined in a manner as follows. For example, if a region around the semiconductor region has a conductivity type opposite to that of the semiconductor region itself, the outer edge is defined as points where respective net impurity concentrations become near zero. This outer edge can be confirmed by measuring with an SCM (scanning capacitance microscope). The net impurity concentration means a difference in concentration between an N-type impurity and a P-type impurity. Then, the depth of a semiconductor region can be defined as the depth at which a peak value of the impurity concentration exists. Also, the downward direction or depth direction is defined as the direction from a main surface of a semiconductor substrate having a light receiving surface toward the semiconductor substrate.

Now, embodiments are hereinafter described with reference to the drawings. A configuration of each embodiment can be appropriately combined with each other. In embodiments, a signal charge is an electron, a first conductivity type is an N-type semiconductor and a MOS transistor is of N-type, but the signal charge may be, of course, an electron hole and the conductivity type may be an opposite type.

(First Embodiment)

Figure 1:
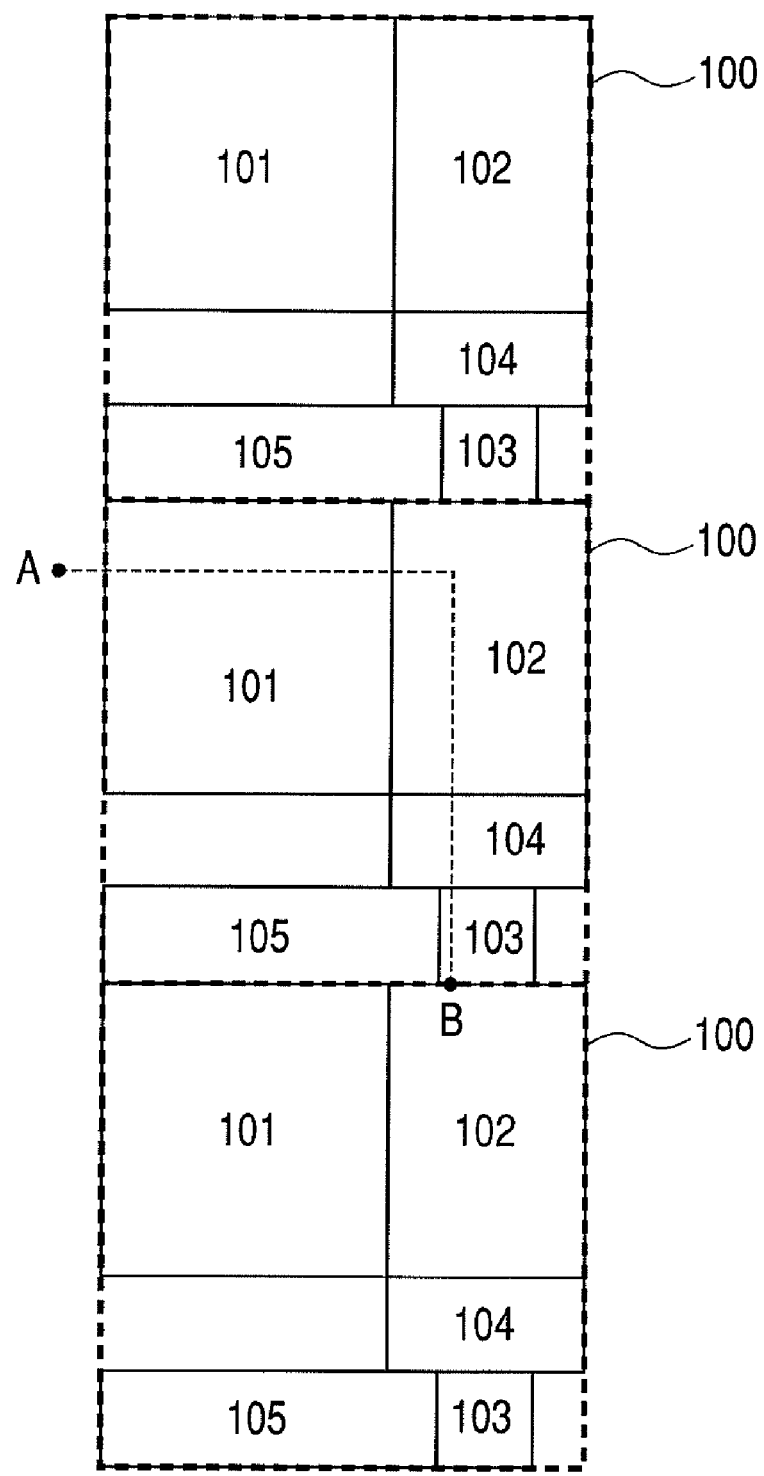
FIG. 1 is a planar schematic view illustrating a first embodiment.
Figure 2:
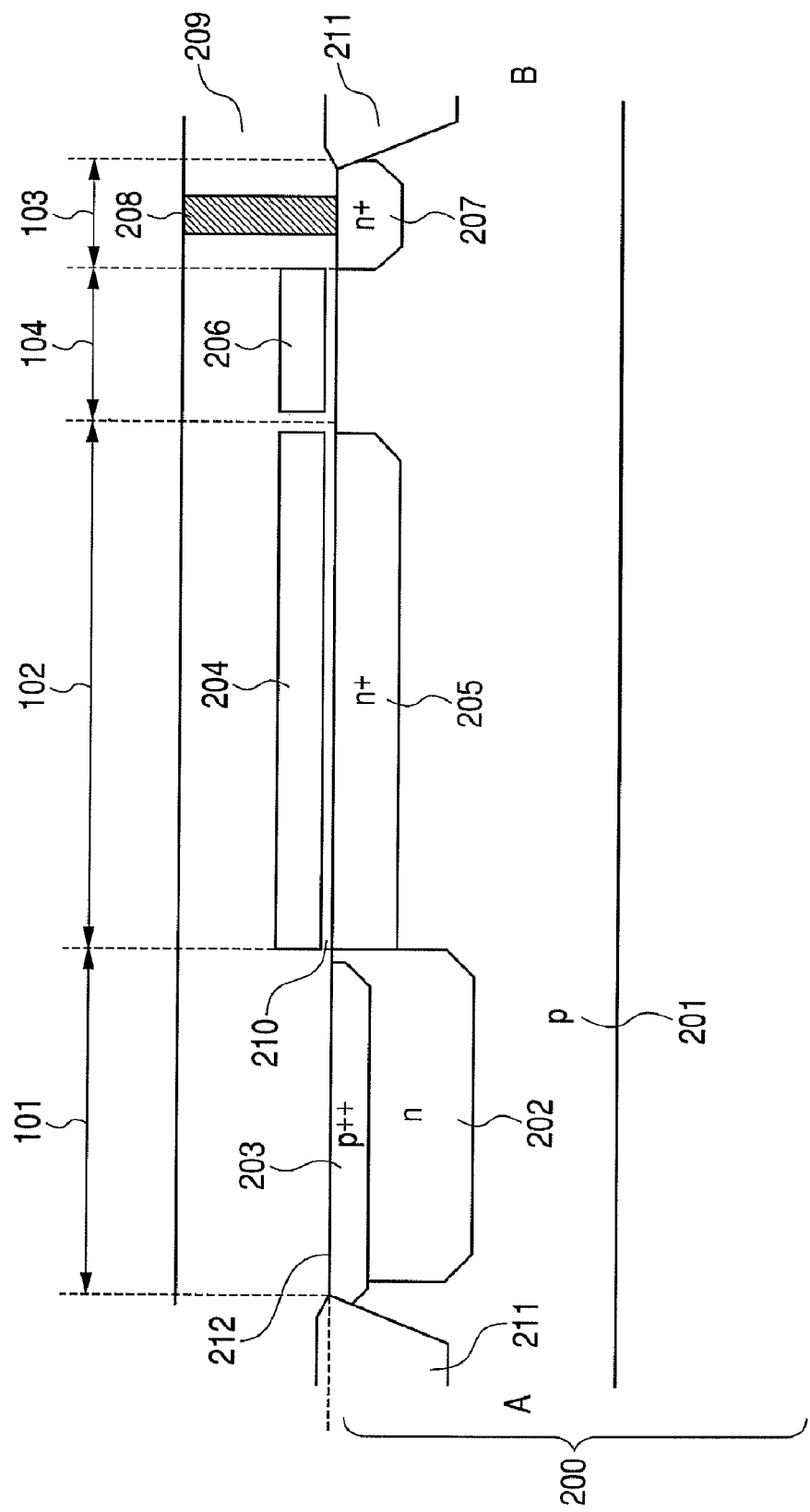
FIG. 2 is a cross-sectional schematic view illustrating the first embodiment.

Firstly, a pixel to which the present invention may be applied is described using FIG. 1. FIG. 1 is a planar schematic view illustrating an element as a block. A pixel 100 includes a photoelectric conversion element 101, a charge storing portion 102, a floating diffusion region 103 and a charge transfer portion 104. Other element is collectively designated simply by the reference number 105. The other element includes, for example, a MOS transistor for amplification and a MOS transistor for resetting and may have any detailed configuration. Also, an element isolation region is omitted. The pixel is the smallest repeating unit that has at least one photoelectric conversion element, and the pixel 100 is arranged in one dimension or two dimensions to form an imaging region. FIG. 1 illustrates three arrays of the pixel 100. FIG. 2 illustrates a cross-sectional view of such pixel 100 taken along the lines A-B.

FIG. 2 is the cross-sectional schematic view taken along the lines A-B in FIG. 1. FIG. 2 illustrates a well 201, a first semiconductor region 202 of a first conductivity type, a second semiconductor region 203 of a second conductivity type, a first gate electrode 204 and a fourth semiconductor region 205 of the first conductivity type. Further, a second gate electrode 206, a third semiconductor region 207 of the first conductivity type, an electrical conductor 208 forming a contact and an insulating film 209 covering the element are illustrated. A gate insulating film 210 and an element isolation region 211 for STI and the like are also shown. On a semiconductor substrate 200, the photoelectric conversion element is arranged, and a main surface 212 of the semiconductor substrate includes a light receiving surface of the photoelectric conversion element 101. The dotted lines show the position of a surface including the main surface 212. Then, the downward direction or depth direction is defined as the direction from the main surface 212 toward the semiconductor substrate 200. The well 201 may be of the first conductivity type or of the second conductivity type, or the semiconductor substrate 200.

The second semiconductor region 203 is stacked on the first semiconductor region 202, and the first and second semiconductor regions 202 and 203 have a P-N junction interface therebetween and form a part of the photoelectric conversion element 101. The third semiconductor region 207 functions as the floating diffusion region, and a signal charge of the first semiconductor region 202 is transferred through the fourth semiconductor region 205 by the second gate electrode 206. The third semiconductor region 207 and the fourth semiconductor region 205 are spaced away from each other, in which the well 201 is arranged. The fourth semiconductor region 205 is arranged at the same depth as the third semiconductor region 207, or the fourth semiconductor region 205 is arranged closer to the main surface 212 rather than the third semiconductor region 207. Then, the fourth semiconductor region 205 has an impurity concentration higher than that of the first semiconductor region 202, and the fourth semiconductor region 205 is arranged closer to the main surface 212 than the first semiconductor region 202 and connected to the first semiconductor region 202. It may be said that the fourth semiconductor region 205 and the first semiconductor region 202 are integrally formed, or their semiconductor regions are continuously arranged. Their upper portions are covered by the first gate electrode 204. Such configuration can allow the thickness in the depth direction of the fourth semiconductor region 205 to be thinner and prevent a depletion layer from coming close in the depth where the gate cannot control. That is, even if the space between the fourth semiconductor region 205 and the third semiconductor region 207 are made narrower due to a reduced size of pixel, the configuration can separate the fourth semiconductor region 205 from the third semiconductor region 207 and facilitate controlling electrical connection. Also, a signal charge of the first semiconductor region 202 can be effectively transferred to the third semiconductor region 207. Further, the fourth semiconductor region having a higher impurity concentration is arranged closer to the main surface 212 rather than the second semiconductor region, and accordingly at a comparatively low depletion voltage, many charges can be stored in an n+ region, thus expecting improvement in the number of saturation signals.

Figure 3:
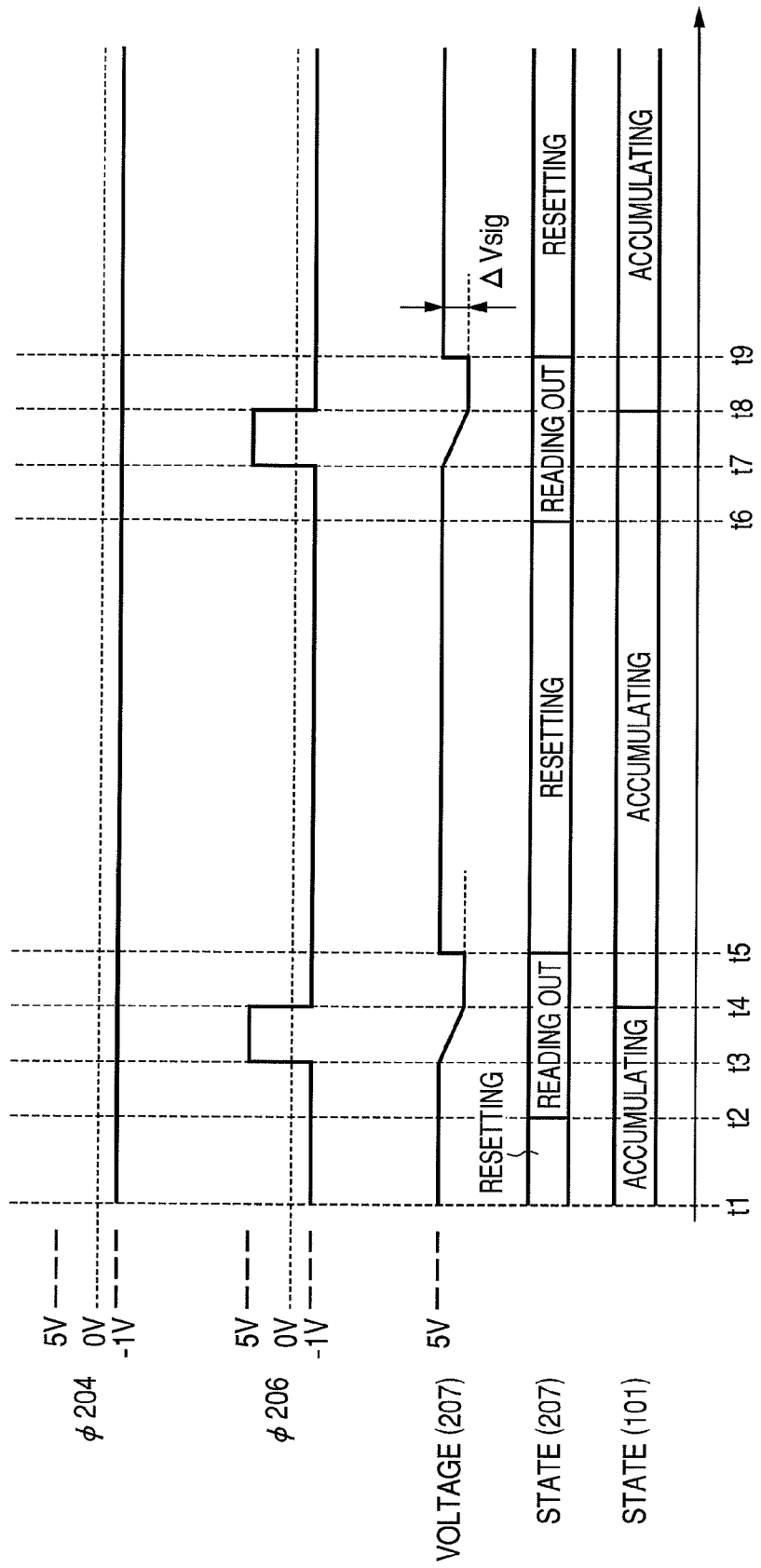
FIG. 3 is an operational timing chart illustrating the first embodiment.

Then, drive of the photoelectric conversion apparatus is described using an operational timing chart illustrated in FIG. 3. A control signal designated by the symbol φ204 controls the first gate electrode 204 and is a voltage supplied to the first gate electrode 204. A control signal designated by the symbol φ206 controls the second gate electrode 206 and is a voltage supplied to the second gate electrode 206. In this embodiment, a low level that the control signal φ204 and the control signal φ206 may take is set to −1 V, and a high level is set to 5 V. The voltage (207) schematically shows change in voltage of the third semiconductor region 207. A state (207) shows operation performed in the third semiconductor region, and a state (101) shows a state of the photoelectric conversion element 101, showing here an accumulation period. Timing is shown at from t1 to t9. The drive is hereinafter described.

At t1, the photoelectric conversion element 101 accumulates a signal charge. The third semiconductor region 207 is supplied with a desired voltage (reset voltage) and is at 5 V. A resetting operation is defined as supplying the desired voltage to the third semiconductor region 207, and the desired voltage is 5 V. Next, at t2, an electrical potential of the third semiconductor region 207 after being reset is read out. The signal from the third semiconductor region 207 after being reset can be used as a noise signal including a noise component at resetting. The noise signal is superimposed on the signal based on the signal charge. Then, the noise component can be removed by subtracting the noise signal from the signal based on the signal charge. The control signal φ204 and the control signal φ206 have been at the low level from t1. During accumulation, the control signal φ204 is at the low level, and accordingly a charge (electron hole) of a polarity opposite to that of the signal charge is accumulated under the first gate electrode 204, thus being able to reduce dark current from the main surface on the fourth semiconductor region 205, that is, the semiconductor substrate. In this embodiment, the control signal φ204 is always set to the low level, such that dark current can be always reduced. Also, the control signal φ206 is at the low level, thus sufficiently separating the fourth semiconductor region 205 from the third semiconductor region 207 and also suppressing dark current produced on a surface of the semiconductor substrate under the second gate electrode.

Next, during from t3 to t4, the control signal φ206 goes to the high level, thereby the fourth semiconductor region 205 is electrically connected to the third semiconductor region 207, and the signal charge produced in the photoelectric conversion element 101 is transferred to the third semiconductor region 207. Then the control signal φ206 returns to the low level, thus stopping transferring the signal charge from the photoelectric conversion element 101 to the third semiconductor region 207. That is, the photoelectric conversion element 101 terminates one accumulation period at t4 and enters a next accumulation period.

While the control signal φ206 is at the high level, the voltage of the third semiconductor region 207 lowers by a voltage ΔVsig of the signal charge transferred from the photoelectric conversion element 101. Then, during from t4 to t5, a signal based on the voltage ΔVsig is output as a video signal. Specifically, if the third semiconductor region 207 is connected to a gate electrode of a MOS transistor for amplification, a signal based on an electrical potential of the third semiconductor region 207 including the voltage ΔVsig is output as a source electrical potential of the MOS transistor for amplification. Then, at t5, the third semiconductor region 207 is reset to return to the state at t1. The drive after t6 is similar to the above.

Next, a potential state of a semiconductor region under the drive mentioned above is described using FIGS. 4A, 4B, 4C and 4D. FIGS. A, 4B, 4C and 4D schematically illustrate a potential state relative to a signal charge of each semiconductor region at some timing point. A potential 202 corresponds to that of the first semiconductor region 202, a potential 204 corresponds to that of the fourth semiconductor region 205 under the first gate electrode 204, a potential 206 corresponds to that of the well under the second gate electrode 206, and a potential 207 corresponds to that of the third semiconductor region 207. FIG. 4A illustrates an initial state, in which a signal charge is not produced in the photoelectric conversion element 101. FIG. 4B illustrates a state corresponding to that during from t1 to t3 in FIG. 3, and FIG. 4C illustrates a state corresponding to that during from t3 to t4 in FIG. 3, and FIG. 4D illustrates a state corresponding to that during from t4 to t5 in FIG. 3. The signal charge is shown by the hatched lines. The potential of each semiconductor region in each state is illustrated by potentials from L41 to L48.

In FIG. 4A, the fourth semiconductor region 205 has an impurity concentration higher than that of the first semiconductor region 202, and accordingly the fourth semiconductor region 205 has the potential L43 lower than the potential L42 of the first semiconductor region 202. Then, although the potential under the second gate electrode is the potential L41, it may be higher. In FIG. 4B, a signal charge produced in the photoelectric conversion element 101 is accumulated. The fourth semiconductor region 205 has the impurity concentration higher than that of the first semiconductor region, and therefore the fourth semiconductor region 205 can store the signal charge more by a difference between the signal charge held at the potential L42 and the signal charge held at the potential L43 than the case where the fourth semiconductor region 205 has the same impurity concentration as the first semiconductor region. In FIG. 4C, a voltage of the high level is supplied to the second gate electrode 206, thus lowering the potential of the well under the second gate electrode 206 to the potential L47. Here, between the first semiconductor region 202 and the third semiconductor region 207, a step-like potential is formed, thereby the signal charge is smoothly transferred to the third semiconductor region 207. In FIG. 4D, a voltage of the low level is supplied to the second gate electrode 206, and accordingly the potential of the well under the second gate electrode 206 goes to the potential L41, completing the transfer of the signal charge. Subsequently, accumulation of a signal charge in the photoelectric conversion element 101 starts again. During FIGS. 4C and 4D, the potential of the fourth semiconductor region 205 becomes higher than that of the well under the second gate electrode 206. Such relationship between the potentials can reduce a residual signal charge in the fourth semiconductor region 205.

As described above, the configuration as shown in this embodiment can improve transfer efficiency while suppressing electrical connection between the second semiconductor region and the third semiconductor region forming a photoelectric conversion element during an undesired time period. Because the fourth semiconductor region can be formed closer to the main surface, that is, shallowly, the fourth semiconductor region is easily connected to a passage of the signal charge, created under the second gate electrode on transferring the signal charge. That is, because of a higher transfer efficiency, the drive at a lower voltage can be performed, compared to a configuration to which this configuration is not applied.

Also, the electrical potential of the first gate electrode 204 is set in a manner that an electron hole is accumulated in the fourth semiconductor region under the first gate electrode 204, which can reduce dark current from the main surface.

Also, in this embodiment, the first gate electrode is always set to a certain electrical potential, and accordingly the first gate electrode can drive the entire pixels in common. Therefore, gate electrodes of the entire pixels can be connected to the same control line, thus reducing the number of control lines and a control circuit. Further, the first gate electrode can be also provided continuously across a plurality of pixels. The structure such that the first gate electrode is provided continuously is a structure wherein the gate electrode formed from the same material extends over a plurality of pixels. Such configuration can reduce the size of pixel. Note that the first gate electrode and the second gate electrode are connected to a different control line, respectively.

(Second Embodiment)

This embodiment differs from the first embodiment in the control signal φ204. Also, in the configuration of the first embodiment, the first semiconductor region differs from the fourth semiconductor region in the relation between their potentials. FIG. 5 illustrates an operational timing chart, and FIG. 6 schematically illustrates a potential corresponding to a signal charge in each semiconductor region when drive is carried out according to FIG. 5. FIG. 5 corresponds to FIG. 3, FIGS. 6A, 6B, 6C and 6D correspond to FIGS. 4A, 4B, 4C and 4D, and a like function is designated by a like symbol and description thereof is omitted.

Firstly, in FIG. 5, the control signal φ204 is not always at a low level and goes to a high level at t3 (and at t7). The control signal φ204 goes to the high level on transferring a signal charge from the photoelectric conversion element 101, thus being able to suppress formation of a potential to block on transferring the signal charge and improve transfer efficiency. Other operation of the drive similar to FIG. 3 is not described.

Figure 6A:
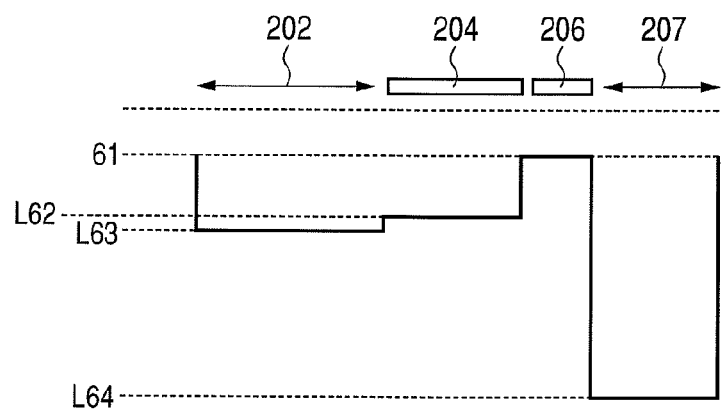
FIGS. 6A, 6B, 6C and 6D are potential maps illustrating the second embodiment.
Figure 6B:
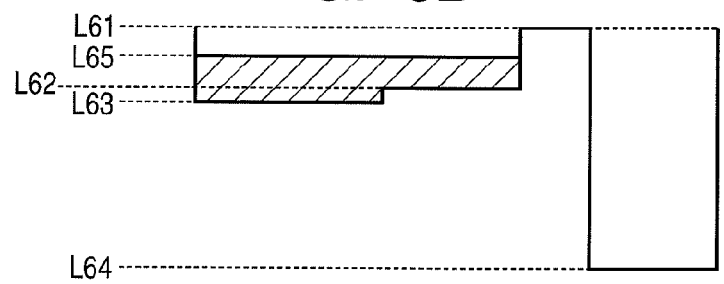
Figure 6C:
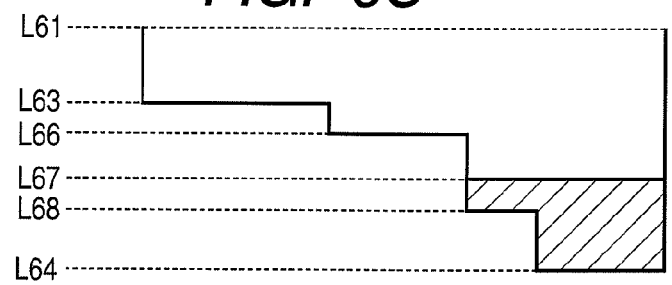
Figure 6D:
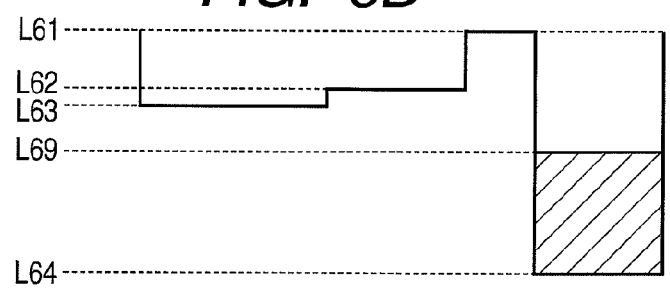

Next, the transfer operation is described in detail using FIGS. 6A, 6B, 6C and 6D. A like state to FIGS. 4A, 4B, 4C and 4D is not described. FIG. 6A illustrates an initial state, in which a signal charge is not produced in the photoelectric conversion element 101. FIG. 6B illustrates a state corresponding to that during from t1 to t3 in FIG. 5, FIG. 6C illustrates a state corresponding to that during from t3 to t11 in FIG. 5, and FIG. 6D illustrates a state corresponding to that during from t4 to t5 in FIG. 5. The signal charge is designated by the hatched lines. A potential of each semiconductor region in each state is shown by potentials from L61 to L69.

In FIG. 6A, a potential of the fourth semiconductor region 205 goes to the potential L62, being higher than the potential L63 of the first semiconductor region 202. A voltage of the first gate electrode 204, and the impurity concentration of the fourth semiconductor region 205 and the depth of the impurity concentration may possibly cause such relation between the potentials. Of course, the relation between the potentials may be similar to that in the first embodiment. In FIG. 6B, a signal charge is accumulated. In the case of the relation between the potentials in this embodiment, the amount of the signal charge capable of being held becomes less than that in the first embodiment. In FIG. 6C, because the control signal φ206 is at the high level, a potential of the well under the second gate electrode 206 changes from the potential L61 to the potential L68. The control signal φ204 also goes to the high level, and the potential of the fourth semiconductor region 205 goes from the potential L62 to the potential L66 lower than the potential L63. Such operation creates a step-like potential between the first semiconductor region 202 and the third semiconductor region 207, thus being able to effectively transfer the signal charge. In FIG. 6D, the control signal φ206 goes to the low level, and the transfer of the signal charge ends.

Now, operation in FIGS. 6C and 6D, that is, operation at t11 between t3 and t4 in FIG. 5 is described. At t3 in FIG. 5, both the control signal φ204 and the control signal φ206 are at the high level. Then, at t11 in FIG. 5, the control signal φ204 goes to the low level, and the control signal φ206, subsequently, goes to the low level. That is, the potential of the fourth semiconductor region 205 is forced to return from the potential L66 to the potential L62, and subsequently the potential of the well under the second gate electrode 206 is forced to go from the potential L68 to the potential L61. Such operation can transfer the signal charge to the third semiconductor region 207 with no signal charges being left behind in the fourth semiconductor region 205. Note that if the control signal φ206 is made to go to the low level before the control signal φ204, the potential L61 forming a barrier is created between the potential L66 of the fourth semiconductor region 205 and the third semiconductor region 207, and accordingly the signal charge is likely to be left behind in the fourth semiconductor region.

As mentioned above, the control signal φ204 is forced to go to the high level on transferring the signal charge, thus being able to more improve transfer efficiency, compared to the first embodiment. Of course, the driving method of this embodiment can be also applied to the configuration having the relation between the potential of the first semiconductor region 202 and the potential of the fourth semiconductor region 205 as shown in FIG. 4A.

(Third Embodiment)

This embodiment differs from the second embodiment in that the low level of the control signal φ204 differs from that of the control signal φ206. In this embodiment, the low level of the control signal φ204 was set to −3 V and the low level of the control signal φ206 was set to −1 V. That is, the low level of the voltage supplied to the second gate electrode is higher than that of the voltage supplied to the first gate electrode. Such relation between the voltages can improve a breakdown voltage between the second gate electrode 206 and the third semiconductor region 207. It is because of the reason as follows. The third semiconductor region 207 is set to a high electrical potential on resetting. At this time, if a voltage of the low level is supplied to the first gate electrode 204 and the second gate electrode 206, an electric field between the second gate electrode 206 and the third semiconductor region 207 adjacent to each other may become large. Then, the voltage of the low level of the second gate electrode 206 is made higher than that of the first gate electrode 204, which can reduce a voltage between the second gate electrode 206 and the third semiconductor region 207 adjacent to each other. Accordingly, mixing of dark current can be reduced while maintaining a dielectric voltage.

Next, this embodiment is described in detail using an operational timing chart in FIG. 7. During an accumulation period of the photoelectric conversion element, the control signal φ204 and the control signal φ206 are at the low level. A value of the control signal φ204 at this time has a voltage value lower than that of the control signal φ207 (higher on the negative side). In other words, a value of the control signal of the low level supplied to the second gate electrode takes a value between a value of the control signal of the low level supplied to the first gate electrode and a value of the control signal of the high level supplied to the second gate electrode. Supplying the voltages in such a manner can reduce mixing of the dark current and maintain the breakdown voltage of the second gate electrode. Of course, the driving method of this embodiment can be applied to the configuration having the relation between the potential of the first semiconductor region 202 and the potential of the fourth semiconductor region 205 as shown in FIG. 4A.

Fourth Embodiment

Figure 8:
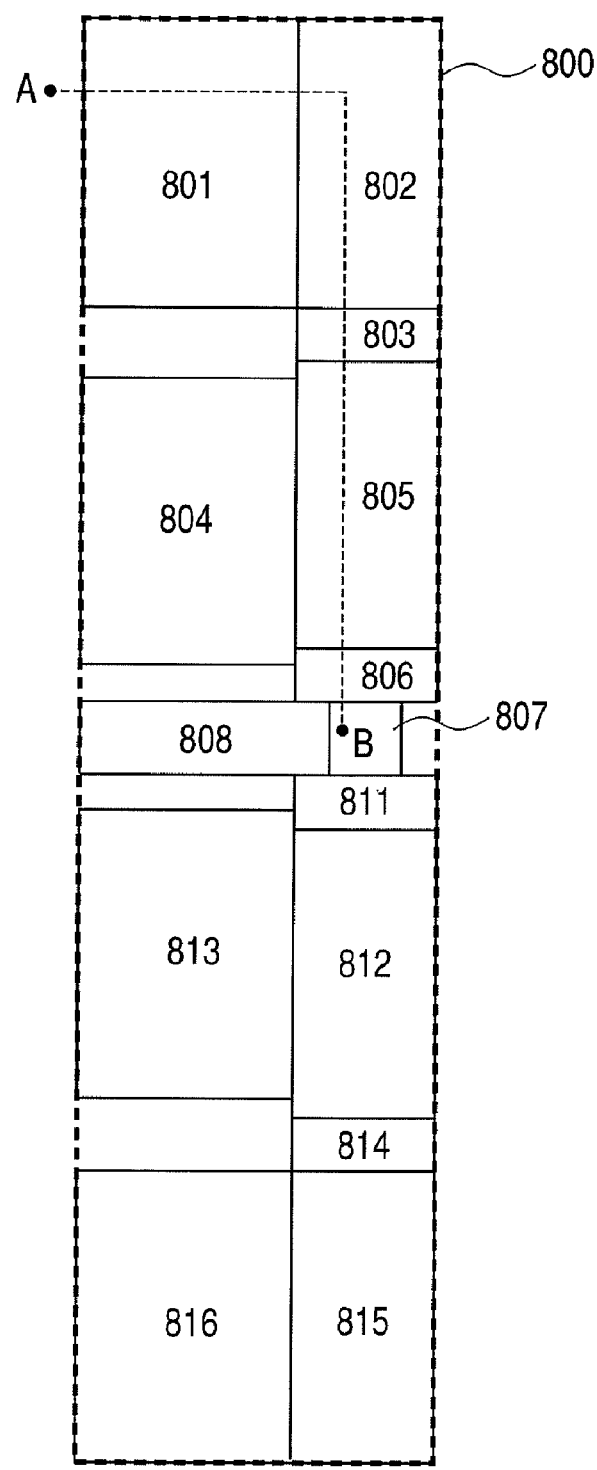
FIG. 8 is a planar schematic view illustrating a fourth embodiment.

This embodiment differs from the first embodiment in a configuration of pixel. FIG. 8 is a planar schematic view illustrating an element as a block. FIG. 8 illustrates photoelectric conversion elements 801, 804, 813 and 816, charge storing portions 802, 805, 812 and 815, charge transfer portions 803, 806, 812 and 815, and a floating diffusion region 807. Other element is collectively illustrated by the reference number 808. The other element includes, for example, a MOS transistor for amplification and a MOS transistor for resetting, a configuration of which may be of any type. A pixel unit 800 includes the four photoelectric conversion elements 801, 804, 813 and 816, which share a read out circuit 808. That is, it can be said that the pixel unit 800 includes four pixels. Each pixel has the photoelectric conversion element, the charge storing portion and the charge transfer portion. For example, a first pixel has the photoelectric conversion element 801, the charge storing portion 802 and the charge transfer portion 803. A second pixel has the photoelectric conversion element 804, the charge storing portion 805 and the charge transfer portion 806. A third pixel has the photoelectric conversion element 813, the charge storing portion 812 and the charge transfer portion 811. A fourth pixel has the photoelectric conversion element 816, the charge storing portion 815 and the charge transfer portion 814. The pixel unit 800 can be divided into a group of the photoelectric conversion elements 801 and 804, and a group of the photoelectric conversion elements 813 and 816. Then, the charge transfer portions 806, 811 and the charge storing portions 805, 812 are shared by the two photoelectric conversion elements, respectively. FIG. 9 illustrates a cross-sectional view of such pixel unit 800, that is, one group thereof, taken along the lines A-B.

FIG. 9 is the cross-sectional schematic view taken along the lines A-B of FIG. 8. FIG. 9 illustrates a well 901, a first semiconductor region 902 of a first conductivity type, a second semiconductor region 903 of a second conductivity type, a first gate electrode 904, a fourth semiconductor region 905 of the first conductivity type, a second gate electrode 906, and a third semiconductor region 910. Further, a third gate electrode 907, a fifth semiconductor region 908 of the first conductivity type and a fourth gate electrode 909 are illustrated. An electrical conductor 911 forms a contact, and an insulating film 912 covers the elements. A gate insulating film is designated by the reference number 213, and an element isolation region for STI and the like is designated by the reference number 214. Although not shown here, a semiconductor region of the first conductivity type of the photoelectric conversion element 804 is also similar to that of the first semiconductor region 902. On a semiconductor substrate 900, the photoelectric conversion elements are arranged, and a main surface 915 of the semiconductor substrate includes a light receiving surface of the photoelectric conversion element 801. The position of a surface including the main surface 915 is shown by the dotted lines. The downward or depth direction is defined as the direction from the main surface 915 toward the semiconductor substrate 900.

The first semiconductor region 902 and the second semiconductor region 903 have a P-N junction interface and form a part of the photoelectric conversion element 101. The third semiconductor region 910 functions as the floating diffusion region. The fifth semiconductor region 908 is arranged between the fourth semiconductor region 905 and the third semiconductor region 910. Then, a signal charge of the first semiconductor region 902 is transferred from the fourth semiconductor region 905 to the fifth semiconductor region 908 by the second gate electrode 906 and further transferred to the third semiconductor region 910 by the fourth gate electrode 909. Then, the fourth semiconductor region 905 and the fifth semiconductor region 908 have an impurity concentration higher than that of the first semiconductor region 902, and also, the fourth semiconductor region 905 and the fifth semiconductor region 908 are positioned closer to the main surface 212 rather than the first semiconductor region 902. The positional relation between the fourth semiconductor region 905 and the fifth semiconductor region 908, and the semiconductor region of the first conductivity type at the photoelectric conversion element 804 is also similar. Then, the first semiconductor region 902 and the fourth semiconductor region 905 are electrically connected to each other, and the fifth semiconductor region 908 and the semiconductor region of the first conductivity type of the photoelectric conversion element 804 are electrically connected to each other. In other words, they are integrally formed or continuously arranged. The first gate electrode 904 covers an upper portion of the fourth semiconductor region 905, and the third gate electrode 907 covers an upper portion of the fifth semiconductor region. Such configuration can reduce the number of elements per photoelectric conversion element, compared to the configuration of the first embodiment. Also, the fourth semiconductor region 905 and the fifth semiconductor region 908 having a higher impurity concentration are positioned closer to the main surface 915 rather than the second semiconductor region 902. Such configuration can effectively transfer the signal charge while facilitating controlling electrical connection and disconnection between the fifth semiconductor region 908 and the third semiconductor region 910. Also, at a comparatively low depletion voltage, many signal charges can be stored in an n+ region, thus expecting improvement in the number of saturation signals. Further, the total area of the same node portion as the floating diffusion region can be provided at an equivalent level to that of the first embodiment. For example, when forming an input portion of a MOS transistor for amplification, voltage sensitivity per signal charge can be maintained as is conventionally done.

Next, one example of drive of such photoelectric conversion apparatus is described using an operational timing chart in FIG. 10. A control signal φ904 controls the first gate electrode 904 and is a voltage supplied to the first gate electrode 904. A control signal φ906 controls the second gate electrode 906 and is a voltage supplied to the second gate electrode 906. A control signal φ907 controls the third gate electrode 907 and is a voltage supplied to the third gate electrode 907. A control signal φ909 controls the fourth gate electrode 909 and is a voltage supplied to the fourth gate electrode 909. In this embodiment, a low level of the control signal φ904 and the control signal φ907 is set to −3 V and a high level is set to 5 V, and a low level of the control signal φ906 and the control signal φ909 is set to −1 V and a high level is set to 5 V. A voltage (910) schematically illustrates change in voltage of the third semiconductor region 910. A state (910) illustrates operation performed in the third semiconductor region, and a state (shutter) illustrates a state of a mechanical shutter in an imaging system, representing exposing and light shielding. Timing is illustrated at from t1 to t14. The drive is hereinafter described. Like operation to the first embodiment is not described.

Firstly, at t1, the photoelectric conversion element 801 and the photoelectric conversion element 804 have accumulated a signal charge. The third semiconductor region 910 has been at 5 V due to a desired voltage (reset voltage) being supplied. Next, at t2, the mechanical shutter is closed to shield against light. At t3, an electrical potential of the third semiconductor region 910 after being reset is read out. The read out signal can be used as a noise signal in a signal from the photoelectric conversion element 804. Then, during a time period from t1 to t3, the control signal φ904, the control signal φ906, the control signal φ907 and the control signal φ907 are at the low level. Because the control signal φ904 is at the low level, a charge (electron hole) having a polarity opposite to the signal charge is accumulated under the first gate electrode 904, thus being able to reduce dark current from the main surface on the fourth semiconductor region 905. Also, because the control signal φ907 is at the low level, a charge (electron hole) having a polarity opposite to the signal charge is accumulated under the third gate electrode 907, thus being able to reduce dark current from the main surface on the fifth semiconductor region 908. In this embodiment, the control signal φ904 is always set to the low level, which can always reduce dark current. Also, the control signal φ906 and the control signal φ909 are set to the low level, thereby the fourth semiconductor region 905 is sufficiently separated from the fifth semiconductor region 908, and the fifth semiconductor region 908 is sufficiently separated from the third semiconductor region 910. At t4, the control signal φ907 and the control signal φ909 go to the high level. Then, the signal charge is transferred from the photoelectric conversion element 804 to the third semiconductor region 910, and a voltage of the third semiconductor region 910 changes by a voltage ΔVsig. At t6, the transfer of the signal charge of the photoelectric conversion element 804 ends, and a signal including the signal charge ΔVsig of the photoelectric conversion element 804 is read out from the third semiconductor region 910. At t5 and t6, the control signal φ907 and the control signal φ909 go to the low level in this order, which can reduce a signal charge that is not transferred.

Next, at t7, the third semiconductor region 910 is reset and the voltage of the third semiconductor region 910 goes to 5 V. Subsequently, reading out the signal charge of the photoelectric conversion element 801 is started. At t8, the control signal φ906 goes to the high level, and the signal charge is transferred from the first semiconductor region 902 and the fourth semiconductor region 905 to the fifth semiconductor region 908. During a time period from t1 to t7, the control signal φ904 is at the low level so as to reduce dark current, and accordingly the dark current has a little effect on the signal charge. Also, the fourth semiconductor region 905 is provided, which can improve transfer efficiency and lower the voltage supplied to the control signal φ906 as the high level. At t9, the electrical potential of the third semiconductor region 910 after being reset is read out. The read out signal can be used as a noise signal in the signal from the photoelectric conversion element 801. Also, the control signal φ907 goes to the high level and the signal charge is transferred to the fifth semiconductor region 908 and held. Because there is not a potential barrier between the photoelectric conversion element 804 and the charge storing portion 805, the photoelectric conversion element 804, on storing the signal charge, can be also used to store the charge in addition. Also in the case of many signal charges, the signal charge can be sufficiently held. At t10, the control signal φ909 goes to the high level, and the signal charge is transferred from the fifth semiconductor region 908 to the third semiconductor region 910. Here, because the control signal φ906, the control signal φ907 and the control signal φ909 are at the high level, an area between the second semiconductor region and the third semiconductor region is put in an electrically conducting condition and a step-like relation between the potentials is formed, then, the signal charge can be effectively transferred. During from t11 to t13, the control signal φ906, the control signal φ907 and the control signal φ909 go to the low level in turn, which can reduce a signal charge that is not transferred and improve transfer efficiency to the third semiconductor region 910. Of course, the control signal φ906, the control signal φ907 and the control signal φ909 may simultaneously go to the low level. Here, the voltage of the third semiconductor region 910 changes by a voltage ΔVsig2 during a time period from t10 to t13, in which, at t10, transfer of the signal charge to the third semiconductor region 910 starts. At t13, a signal based on the electrical potential of the third semiconductor region 910 is output, and a signal including the voltage ΔVsig2 is read out. At t14, the third semiconductor region 910 is reset and returns to the state before exposing, and the mechanical shutter is opened (exposing), assuming the state at t1. Then, even if the control signal φ907 and the control signal φ909 simultaneously go to the high level at t10, the transfer can be carried out. Also, if not overlapped with the time period for reading out the noise signal, the control signal φ906, the control signal φ907 and the control signal φ909 after t8 may simultaneously go to the high level.

Figure 11A:
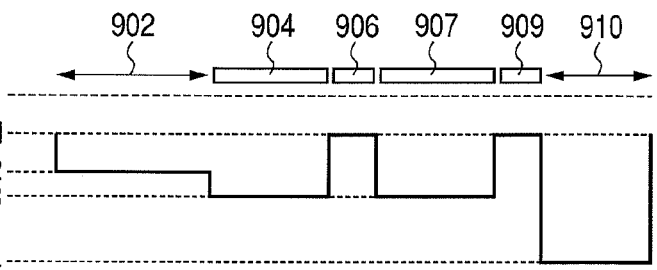
FIGS. 11A, 11B, 11C, 11D, 11E and 11F are potential maps illustrating the fourth embodiment.
Figure 11B:
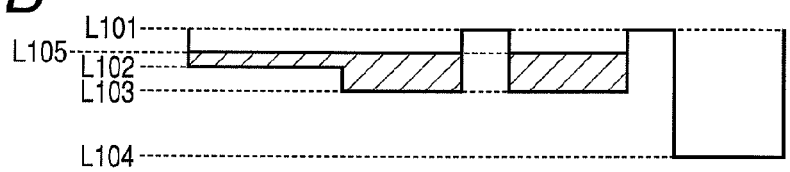
Figure 11C:
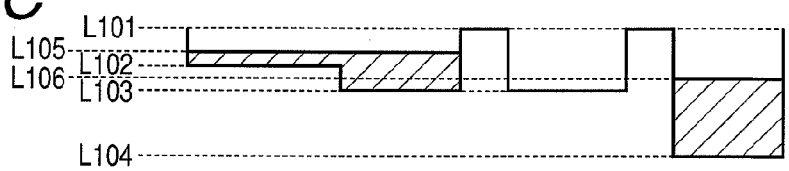
Figure 11D:
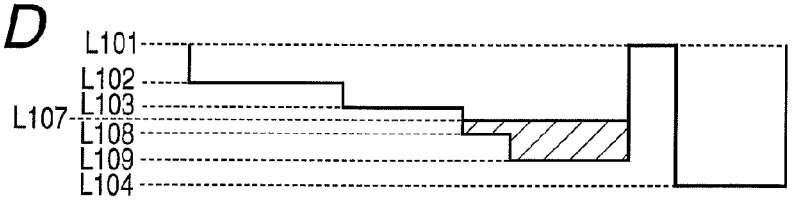
Figure 11E:
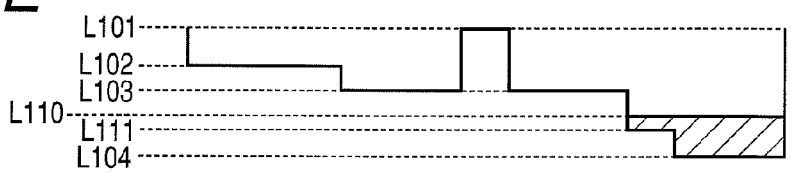
Figure 11F:
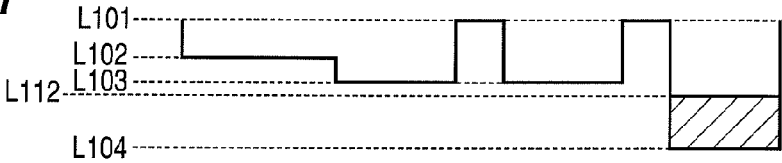

Next, a potential state of a semiconductor region under such drive is described using FIGS. 11A, 11B, 11C, 11D, 11E and 11F. FIGS. 11A, 11B, 11C, 11D, 11E and 11F schematically illustrate a potential of each semiconductor region relative to a signal charge at some timing point. A potential 902 corresponds to that of the first semiconductor region 902, a potential 904 corresponds to that of the fourth semiconductor region 905 under the first gate electrode 904, and a potential 906 corresponds to that of a well under the second gate electrode 906. A potential 907 corresponds to that of the fifth semiconductor region 908 under the third gate electrode 907, a potential 909 corresponds to that of a well under the fourth gate electrode 909, and a potential 910 corresponds to that of the third semiconductor region 910. FIG. 11A illustrates an initial state, in which a signal charge is not produced in the photoelectric conversion element 801 and the photoelectric conversion element 804. FIG. 11B illustrates a state corresponding to that during from t1 to t3 in FIG. 10, FIG. 11C illustrates a state corresponding to that during t6 in FIG. 10 and FIG. 11D illustrates a state corresponding to that during t9 in FIG. 10. FIG. 11E illustrates a state corresponding to that during t12 in FIG. 10 and FIG. 11F illustrates a state corresponding to that during t13. The signal charge is shown by the hatched lines. A potential of each semiconductor region in each state is shown by potentials from L101 to L112.

In FIG. 11A, because the fourth semiconductor region 905 and the fifth semiconductor region 908 have an impurity concentration higher than that of the first semiconductor region 902, the fourth semiconductor region 905 and the fifth semiconductor region 908 have the potential L103 lower than the potential L102 of the first semiconductor region 902. Then, although a potential under the second gate electrode 906 and the fourth gate electrode 907 is the potential L101, it may be a higher potential. Then, to each gate electrode, a voltage of the low level is supplied. In FIG. 11B, a signal charge produced in the photoelectric conversion element 801 is accumulated in the second semiconductor region 902 and the fourth semiconductor region 905. At the same time, a signal charge produced in the photoelectric conversion element 804 is accumulated in the fifth semiconductor region 908 and the semiconductor region (not shown) of the first conductivity type forming the photoelectric conversion element 804. Then, for simplicity, assuming that the photoelectric conversion element 801 and the photoelectric conversion element 804 have the same amount L105 of the signal charge. Subsequently, the signal charge from the photoelectric conversion element 804 is read out. Between FIGS. 11B and 11C, a voltage of the high level is supplied to the fourth gate electrode 909 and a potential of the well under the fourth gate electrode 909 is lowered, and the signal charge is transferred from the fifth semiconductor region 908 to the third semiconductor region 910. FIG. 11C illustrates a state in that the voltage of the low level is supplied to the fourth gate electrode 909. The signal charge of the photoelectric conversion element 804 held in the fifth semiconductor region 908 is held in the fourth semiconductor region. Here, the signal charge held in the fifth semiconductor region 908 can be also transferred completely to the third semiconductor region 910. Subsequently, reading out the signal charge of the photoelectric conversion element 801 is started.

In FIG. 11D, a voltage of the high level is supplied to the second gate electrode 906 and the third gate electrode 907. Then, the potential of the well under the second gate electrode 906 has changed from the potential L101 to the potential L107, and the potential of the fifth semiconductor region 908 has changed from the potential L103 to the potential L109. At this time, a potential between the fourth semiconductor region 905 and the fifth semiconductor region 908 has been made step-like, and the signal charge of the photoelectric conversion element 801 held in the second semiconductor region 902 and the fourth semiconductor region 905 is effectively transferred to the fifth semiconductor region 905. In FIG. 11E, a voltage of the high level is supplied to the fourth gate electrode 909, and the potential of the well under the fourth gate electrode 909 lowers from the potential L101 to the potential L111. Here, a step-like potential is formed between the fifth semiconductor region 908 and the third semiconductor region 910, and thus effectively transferring the signal charge from the fifth semiconductor region 908 to the third semiconductor region 910. In FIG. 11F, a voltage of the low level is supplied to the fourth gate electrode 909 and the potential of the well under the fourth gate electrode 909 goes to the potential L101, and the transfer of the signal charge ends.

As mentioned above, the configuration of this embodiment can reduce the number of elements compared to the configuration of the first embodiment. Further, the fourth semiconductor region 905 having a higher impurity concentration is arranged closer to the main surface 915 rather than the second semiconductor region 902. This configuration can effectively transfer the signal charge while facilitating controlling electrical connection and disconnection between the fourth semiconductor region 905 and the fifth semiconductor region 908. Also, the fifth semiconductor region 908 having a higher impurity concentration is arranged closer to the main surface 915 rather than the semiconductor region (not shown) of the first conductivity type forming the photoelectric conversion element 804. This configuration can effectively transfer the signal charge while facilitating controlling electrical connection and disconnection between the fifth semiconductor region 908 and the third semiconductor region 910. Therefore, the transfer efficiency of the signal charge from the first semiconductor region 902 to the third semiconductor region 910 can be improved. Also, at a comparatively low depletion voltage, many signal charges can be stored in the n+ region, thus expecting improvement in the number of saturation signals.

Further, the first gate electrode 904 and the third gate electrode 907 are set to an electrical potential so as to accumulate an electron hole under respective gate electrodes, which can reduce dark current from the main surfaces on the fourth semiconductor region 905 and the fifth semiconductor region 908. Then, the first gate electrode 904 may be always set to a certain electrical potential, and accordingly a gate electrode connected in common to the entire pixels can be used. Common connection to the entire pixels can reduce the number of control lines and a control circuit, and further, a gate electrode can be provided in common, which can reduce the size of pixel. Of course, the first gate electrode 904 may be driven in the manner of the second embodiment.

Then, in this embodiment, the drive, in the case where the mechanical shutter is used, has been described. When the signal charge of the photoelectric conversion element 801 is read out under the drive as shown in FIG. 10, providing the mechanical shutter can reduce an effect of the signal charge produced in the photoelectric conversion element 804. But the mechanical shutter may be optionally used.

Also, although, in this embodiment, the configuration has been described in which the pixel unit includes the four photoelectric conversion elements, a configuration may be such that the pixel unit includes two photoelectric conversion elements, that is, the two photoelectric conversion elements 801 and 804, and the other circuit 808. The pixel unit may have any number of photoelectric conversion elements.

(Application to Imaging System)

Figure 12:
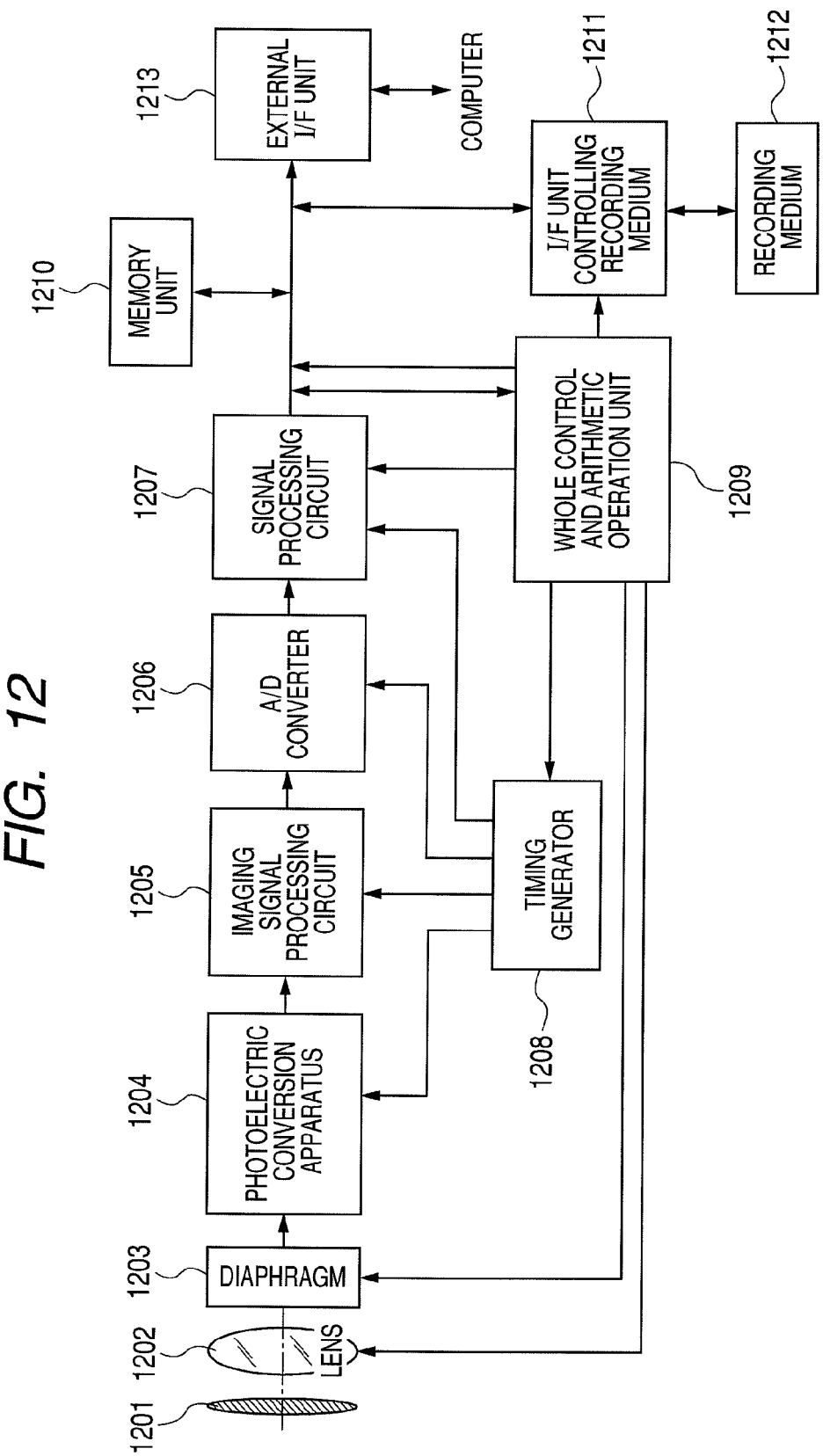
FIG. 12 is a block diagram illustrating an imaging system.

This embodiment is described, using FIG. 12, about the cases where an imaging system adopts the photoelectric conversion apparatus described in from the first embodiment to the fourth embodiment. The imaging system includes a digital still camera, a digital video camera, and a digital camera for a mobile phone.

FIG. 12 illustrates a configuration of a digital still camera. An optical image of an object is formed on an imaging area of a photoelectric conversion apparatus 1204 through an optical system including a lens 1202. A barrier 1201 having both a protection function of the lens 1202 and a main switch function may be provided outside of the lens 1202. A diaphragm 1203 to adjust the amount of light outgoing from the lens 1202 may be provided for the lens 1202. An imaging signal processing circuit 1205 applies various compensations, clamping and other processing to imaging signals output from the photoelectric conversion apparatus 1204 through a plurality of channels. The imaging signals output from the imaging signal processing circuit 1205 through the plurality of the channels are converted from analog to digital by an A/D converter 1206. A signal processing circuit 1207 (image processing portion) applies various compensations, data compression and other processing to image data output from the A/D converter 1206. The photoelectric conversion apparatus 1204, the imaging signal processing circuit 1205, the A/D converter 1206 and the signal processing circuit 1207 operate according to a timing signal generated by a timing generator 1208. Each block is controlled by a whole control and arithmetic operation unit 1209. Further, a memory unit 1210 for temporarily storing the image data and an I/F unit controlling recording medium 1211 for recording an image on a recording medium and reading out are provided. A recording medium 1212 includes a semiconductor memory and is removable. Further, an external I/F unit 1213 for communicating with an external computer and the like may be provided. Then, the device including from the imaging signal processing circuit 1205 to the timing generator 1208 may be formed on the same chip as the photoelectric conversion apparatus 1204.

Next, operation shown in FIG. 9 is described. In response to opening of the barrier 1201, a main power supply, a power supply for a control system and a power supply for a circuit of an imaging system such as the A/D converter 1206 are turned on in sequence. Subsequently, to control the amount of exposing light, the whole control and arithmetic operation unit 1209 opens the diaphragm 1203. A signal output from the photoelectric conversion apparatus 1204 passes through the imaging signal processing circuit 1205 and is supplied to the A/D converter 1206. The A/D converter 1206 converts the signal from analog to digital and outputs it to the signal processing circuit 1207. The signal processing circuit 1207 processes the data and supplies it to the whole control and arithmetic operation unit 1209, and the whole control and arithmetic operation unit 1209 computes to determine the amount of exposing light. The whole control and arithmetic operation unit 1209 controls the diaphragm based on the amount of exposing light determined.

Next, the whole control and arithmetic operation unit 1209 extracts a high-frequency component from the signal output from the photoelectric conversion apparatus 1204 and processed by the signal processing circuit 1207, and computes a distance to an object of shooting based on the high-frequency component. Subsequently, by driving the lens 1202, it is determined whether the lens 1202 is focused or not. When determined to be not focused, the distance is computed by driving the lens 1202 again.

Then, after confirming focusing, actual exposing is started. After the exposing ends, the imaging signal output from the photoelectric conversion apparatus 1204 is compensated and processed by the imaging signal processing circuit 1205, converted from analog to digital by the A/D converter 1206 and processed by the signal processing circuit 1207. The image data processed by the signal processing circuit 1207 is stored in the memory unit 1210 by the whole control and arithmetic operation unit 1209. Subsequently, the image data stored in the memory unit 1210 is recorded on the recording medium 1212 through the I/F unit controlling recording medium by control of the whole control and arithmetic operation unit 1209. Also, the image data is supplied to the computer and the like through the external I/F unit 1213 and processed.

The photoelectric conversion apparatus of the present invention is applied to the imaging system in such a manner.

Use of the photoelectric conversion apparatus of the present invention can allow for the drive at the low voltage, which can reduce power consumption in the imaging system. Also, the transfer efficiency of the signal charge is improved, thus being able to provide a better video signal.

The present invention can improve the transfer efficiency by arranging the forth semiconductor region 205 of the first conductivity type having a higher concentration, under most of the first gate electrode 204 and in depth closer to the main surface 212 rather than the second semiconductor region 202 forming the photoelectric conversion element 101. Also, the voltage value of the first gate electrode 204, instead of that of the second semiconductor region 203 of the second conductivity type on the surface of the photoelectric conversion element 101, is controlled, thus suppressing the dark current. Also, the transfer efficiency is high and the voltage supplied to the second gate electrode on transferring the charge, for transferring the charge can be low, and accordingly, the driving voltage can be set within a voltage range used in a CMOS process even if a higher concentration is given to the fourth semiconductor region 205. As the result, the number of saturation signals can be also increased.

As mentioned above, although the present invention has been described with reference to specific embodiments, the present invention should not be limited to these embodiments. Modifications and combinations may be appropriately made as long as not departing from the spirit and scope of the present invention. For example, in the embodiments, the signal charge has been described as an electron, but it may be an electron hole. In this case, each semiconductor region only has an opposite conductivity type and the voltage supplied also has an opposite polarity. Further, the voltage of the low level supplied to the first gate electrode and the second gate electrode has been the negative voltage, but this may be a positive voltage.

Also, the low level of the control signal φ204 should not be limited to −1 V, and an electron hole may be accumulated under the first gate electrode 204. The low level of the control signal φ204 and the control signal φ206 can electrically separate the photoelectric conversion element 101 from the third semiconductor region 207 (in a non-conducting state), and setting the low level to a voltage value such as −1 V can allow for sufficient separation. Further, the first semiconductor region and the second semiconductor region may be arranged under the first gate electrode 204 (the semiconductor region 102).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-123439, filed May 9, 2008, which is hereby incorporated by reference in its entirety.

The invention claimed is:

1. A photoelectric conversion apparatus comprising:
a semiconductor substrate having a main surface;
a first semiconductor region of a first conductivity type forming a part of a photoelectric conversion element;
a second semiconductor region of a second conductivity type opposite to the first conductivity type being stacked on the first semiconductor region, and forming a part of the photoelectric conversion element;
a third semiconductor region of the first conductivity type to which a signal charge transferred from the photoelectric conversion element;
a fourth semiconductor region of the first conductivity type having an impurity concentration higher than that of the first semiconductor region, being arranged between the first and third semiconductor region and being arranged between the second and third semiconductor regions, and being connected to the first semiconductor region, wherein the bottom of the fourth semiconductor region is closer to the main surface than that of the first semiconductor region;
a first gate electrode arranged over the fourth semiconductor region, an insulating film arranged on the main surface and arranged between the first gate electrode and the fourth semiconductor region; and
a second gate electrode arranged between the third and fourth semiconductor regions, and arranged over the insulating film.

2. The photoelectric conversion apparatus according to claim 1, wherein
each of a plurality of the photoelectric conversion elements including the first and second semiconductor regions is arranged,
each of the plurality of the photoelectric conversion elements is arranged correspondingly to each of a plurality of the fourth semiconductor regions, and
a plurality of the first gate electrodes are arranged and connected commonly to a control line.

3. The photoelectric conversion apparatus according to claim 1, wherein
each of a plurality of the photoelectric conversion elements including the first and second semiconductor regions is arranged,
each of the plurality of the photoelectric conversion elements is arranged correspondingly to each of a plurality of the fourth semiconductor regions, and
the first gate electrode is arranged continuously though the plurality of the fourth semiconductor regions.

4. The photoelectric conversion apparatus according to claim 1,
wherein a first pixel and a second pixel each having the first, second and fourth semiconductor regions and the first and second gate electrodes, such that between the fourth and third semiconductor regions of the first pixel, the fourth semiconductor region of the second pixel are arranged, and
wherein the plurality of the pixels have a common third semiconductor region.

5. The photoelectric conversion apparatus according to claim 4, wherein the signal charge of the first pixel is transferred to the third semiconductor region through the fourth semiconductor region of the second pixel.

6. An imaging system comprising:
a photoelectric conversion apparatus according to claim 1; and
a signal processing circuit for processing a signal output from the photoelectric conversion apparatus.

7. A driving method of a photoelectric conversion apparatus according to claim 1, wherein at least during a period of accumulating the signal charge in the photoelectric conversion element, a voltage is supplied to the first gate electrode for accumulating a charge carrier of a polarity opposite to that of the signal charge in the fourth semiconductor region.

8. The driving method according to claim 7, wherein the second gate electrode is supplied with a voltage to electrically disconnect between the third and fourth semiconductor regions, and a value of the voltage to set electrically disconnect between the third and fourth semiconductor regions is between a value of the voltage supplied to the first gate electrode for accumulating a charge of the polarity opposite to that of the signal charge in the fourth semiconductor region and a value of a voltage to electrically connect between the third and fourth semiconductor regions.

9. The photoelectric conversion apparatus according to claim 1, wherein the bottom of the fourth semiconductor region is arranged closer to the main surface rather than that of the third semiconductor region.

10. The photoelectric conversion apparatus according to claim 1, wherein the first and second gate electrodes are connected to respectively different drive wirings.

* * * * *